United States Patent [19]

Frisbie et al.

[11] 4,170,290

[45] Oct. 9, 1979

[54] LIFT AND FEED MECHANISM FOR HIGH SPEED INTEGRATED CIRCUIT HANDLER

[75] Inventors: Milo W. Frisbie; Mavin C. Swapp, both of Mesa, Ariz.

[73] Assignee: Motorola, Inc., Schaumburg, Ill.

[21] Appl. No.: 772,695

[22] Filed: Feb. 28, 1977

[51] Int. Cl.² .......................................... B65G 43/00
[52] U.S. Cl. .................... 198/524; 198/563; 198/688; 198/836
[58] Field of Search ............. 198/688, 725, 607, 643, 198/546, 563, 629, 524, 502, 857, 835, 693, 692, 836; 193/25 FT, 38; 209/81 R

[56] References Cited

U.S. PATENT DOCUMENTS

| 527,412 | 10/1894 | Coxe | 198/688 X |
|---|---|---|---|
| 3,253,692 | 5/1966 | Ota | 198/835 X |
| 3,294,217 | 12/1966 | Kay | 198/563 |
| 3,727,757 | 4/1973 | Boissicat | 209/81 R |
| 3,836,022 | 9/1974 | Ims | 198/693 X |
| 3,850,289 | 11/1974 | Behr et al. | 198/857 X |

FOREIGN PATENT DOCUMENTS 2222281  3/1973  France .................................. 193/25 FT Primary Examiner—Robert W. Saifer
Assistant Examiner—Douglas D. Watts
Attorney, Agent, or Firm—John A. Fisher

[57] ABSTRACT

An apparatus for lifting packaged integrated circuit parts and feeding them into the input reservoir of a high-speed handler and tester. Parts slide down an input track to the bottom of a fiber-faced belt stretched around two vertically disposed rollers. The leads of the packaged parts are held in frictional contact with the belt fibers which lift the parts to the top of the handler. Efficient operation is accomplished by providing for loading and unloading parts at the same approximate location.

4 Claims, 3 Drawing Figures

U.S. Patent — Oct. 9, 1979 — 4,170,290

LIFT AND FEED MECHANISM FOR HIGH SPEED INTEGRATED CIRCUIT HANDLER

BACKGROUND

This invention relates to an apparatus for lifting packaged integrated circuit parts and feeding them into the input reservoir of a high-speed handler and tester.

In the semiconductor industry integrated circuits are given a series of final electrical tests before the circuits are used or sold. For economic reasons, especially in view of the very large number of circuits manufactured and tested, it is necessary that the time required for handling the circuits be kept as short as possible. For this reason, machines have been developed for rapidly handling parts as they are tested and sorted by high-speed computerized testers.

Untested circuits are usually stored in commonly available A-frame sleeves. Parts are dump transferred from these sleeves into the reservoir of a handler, tested, sorted into test categories, and then reloaded into sleeves for storage. Commercially available handlers require that untested parts be loaded into one location, usually at the top of the handler, and tested parts be unloaded at a different location, usually near the bottom. The operator must stand and reach to load parts, and then must move to unload tested parts. With some machines the sleeve of untested parts constitutes at least a portion of the reservoir of untested parts so a different sleeve must be picked up and handled to unload tested parts. This requires the multiple handling of the storage sleeves. This method of loading and unloading parts is inconvenient for the operator and is inefficient in both time and motion required.

Accordingly, a need existed for an apparatus that would quickly and efficiently lift and feed integrated circuit parts into a high-speed handler for test.

SUMMARY

It is an object of this invention to provide an apparatus for lifting and feeding integrated circuit parts into the reservoir of a high-speed handler and tester.

it is further object of this invention to provide a lift and feed apparatus which allows the loading and unloading of parts in a convenient, efficient manner, as by a seated operator.

The attainment of the foregoing and related objects and advantages may be achieved through use of the novel handling apparatus herein disclosed.

Untested parts are stored in A-frame sleeves. The operator dump loads a sleeve of untested parts into a gravity feed track. The untested parts slide down this input track to a fiber-faced belt which moves on two vertically disposed pulleys. The leads of the integrated circuit parts are held by friction against the fibers of the belt. The moving belt, in turn, raises the parts to the top of the handler where they slide into a gravity feed reservoir ready for test. From this reservoir parts are conveyed by the high-speed handler to a test fixture where they are tested and sorted into similar categories. The sorted parts drop into sort tracks for temporary storage. The exits from the sort tracks are in close proximity to the input of the lift and feed mechanism so that the operator can easily reach from one to the other. When a sort track fills with similar parts, the operator loads them into an A-frame sleeve for storage. The sequence continues in this manner with the operator emtyping a sleeve of untested parts into the apparatus and then filling the same sleeve with sorted parts. The operation is performed quickly and efficiently with little wasted motion.

The elements of the invention and the benefits to be derived therefrom should be more readily apparent after review of the following more detailed description of the invention taken in connection with the drawings.

THE DRAWINGS

DETAILED DESCRIPTION OF THE INVENTION

Figure 1:
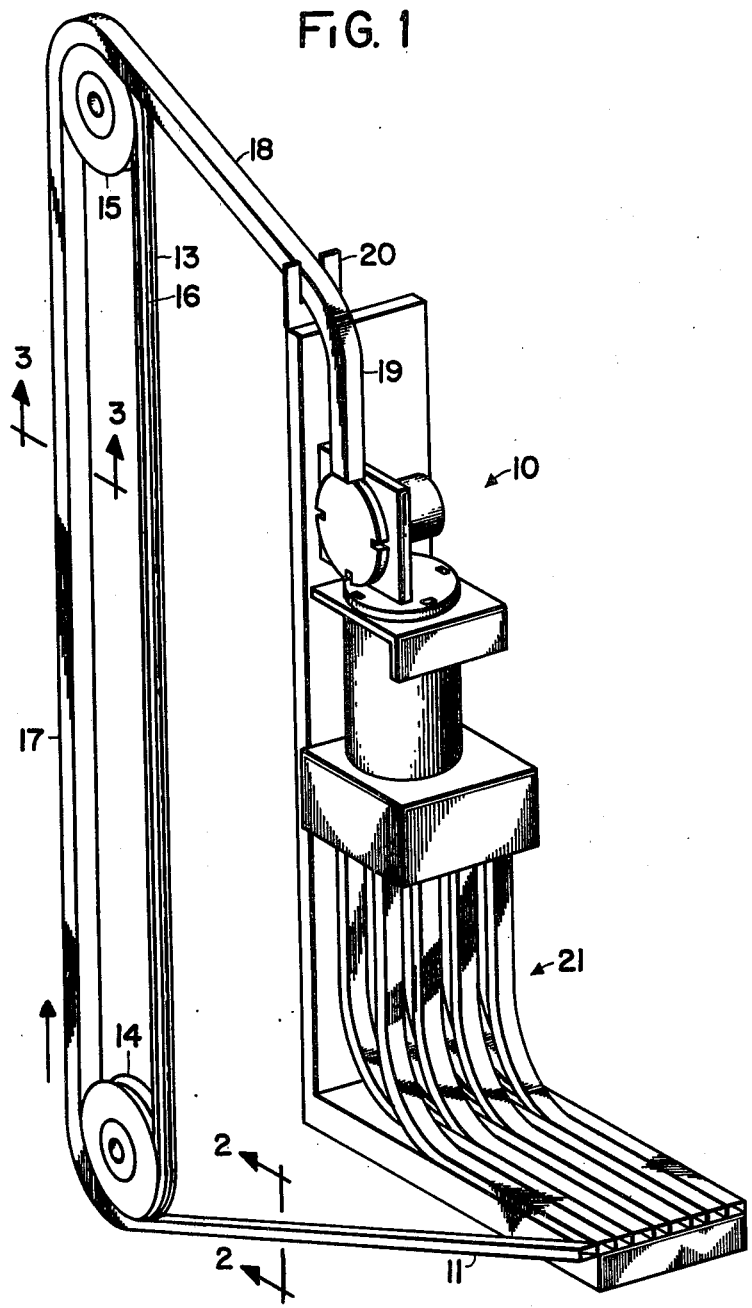
FIG. 1 is a perspective view of the apparatus shown in connection with a high-speed handler.

FIG. 1 shows the invention in perspective view as it would be used in cooperation with a high-speed handler 10 such as described in a co-pending application. Integrated circuits are packaged in conventional ceramic or plastic dual-in-line packages. These packaged parts are stored in A-frame sleeves which hold from twenty-five to fifty parts each, depending on the package size. Untested parts are dump transferred from an A-frame sleeve into input track 11. Input track 11 is a shallow, U-shaped metal slide 12a shown schematically in cross section in FIG. 2. The parts are loaded into track 11 with their leads pointing up so that the leads straddle portion 12b of the track. Thus, the packaged parts are loosely constrained between portions 12a and 12b of track 11. Track 11 can be, for example, about twenty-five inches in length and inclined at an angle of about 30°–40°. The track 11 is essentially open, allowing an operator access to parts that happen to become jammed. Untested parts slide down track 11 under the influence of gravity. At the bottom of track 11 a continuous fiber-faced belt 13 is stretched around pulleys 14 and 15. Belt 13 can be a nylon fiber belt about three-quarters of an inch wide and having one-eighth inch long bristles on a one-sixteenth inch thick mat backing. Pulley 14 and 15 can be about six inches in diameter. Pulley 14 is motor driven to provide motion of the belt in the direction shown by the arrow. Overlying the total length of belt 13 and centered on the belt is a rubber O-ring, a portion of which is shown by the numeral 16.

When a part falls to the bottom of input track 11 the package leads straddle the O-ring 16, the ends of the package leads catch in the belt fibers, and the part is lifted by the moving fiber-faced belt 13.

The O-ring 16 which can be, for example, about three-sixteenths of an inch in cross-sectional diameter serves to control the depth to which the leads penetrate the belt 13. It has been found that without the O-ring the leads would often become entangled in the mat backing of belt 13. This entanglement could cause bending of the leads. Use of O-ring 16 prevents the bending of leads and allows a variety of fiber materials and fiber lengths to be used.

Figure 3:
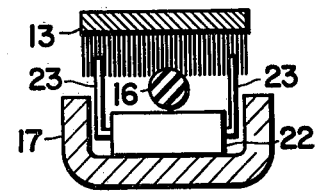
FIG. 3 is a cross-sectional view showing a part as it is held by the fiber-faced belt.

The package leads are held in frictional contact with the fibers of the belt by track portion 17. Track portion 17 is a continuation of the U-shaped track 12a but without portion 12b. Such an arrangement of fiber belt 13, O-ring 16, and track portion 7 allows parts to be supported and lifted independently to the top of pulley 15. This is shown schematically by FIG. 3, which is a cross-sectional view taken as indicated in FIG. 1. An integrated circuit part 22 is shown with its leads 23 embedded in the belt fibers.

When a part is lifted to the top of pulley 15 it drops into track portion 18 and falls into track portion 19 under the influence of gravity. Track portion 19 serves as a gravity feed reservoir for high-speed handler 10. Track portions 18 and 19 can have the same cross-sectional shape as input track 11 shown in FIG. 2.

An optical sensor 20 located at the top of track 19 indicates when rack 19 is filled with integrated circuit parts. The electrical output signal of sensor 20 controls motor driven pulley 14. Pulley 14 turns, causing belt 13 to lift parts and drop them into track 18 and track 19 until optical sensor 20 indicates that track 19 is full. When track 19 is full, the signal from sensor 20 causes pulley 14 to stop turning, stopping the lifting of parts by belt 13, until some of the parts are emptied from track 19 by handler 10. Pulley 14 starts turning again when optical sensor 20 indicates that track 19 is not completely filled with parts.

Figure 2:
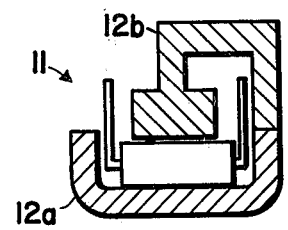
FIG. 2 is a cross-sectional view showing the shape of the tracks used in the apparatus.

Parts drop from track 19 into handler 10 where they are tested and sorted into categories depending on their electrical characteristics. Categorized parts are dropped from the handler into sort tracks, which are shown in FIG. 1 by the numeral 21. The sort tracks which can have the same cross-sectional shape as track 11 shown in FIG. 2 provide temporary storage of similar parts. When a sort track becomes filled with tested parts, those parts are emptied into an A-frame sleeve for more permanent storage. The sleeves thus filled contain tested parts of similar electrical characteristics.

A sleeve of untested parts which is emptied into input track 11 can then be used to unload one of the sort tracks 21. This simplifies the operation by eliminating the multiple handling of storage sleeves. The ends of sort tracks 21 are in close proximity to the input of input track 11 so that a seated operator can easily and conveniently perform the load and unload operations.

In this particular embodiment, the axes of pulleys 14 and 15 are separated by a vertical distance of about fifty-two inches to be consistent with the particular high-speed handler used. This distance could, of course, be changed if the invention was used with some other handler configuration.

What is claimed is:

1. An apparatus for lifting packaged integrated circuit parts and feeding them into a high-speed handler and tester, said parts having a body portion with lead portions extending therefrom, said apparatus comprising:
    a gravity feed input track into which said parts can be loaded,
    a continuous vertically disposed fiber-faced belt, said input track and said fiber-faced belt positioned to allow parts placed on said input track to move down said input track to said fiber-faced belt where said lead portion can penetrate and be held by the fibers of said fiber-faced belt,
    an O-ring overlying said fiber-faced belt to control the depth to which said lead portions penetrate said fibers of said fiber-faced belt,
    means for moving said fiber-faced belt and thereby said parts held by said fibers,
    gravity feed reservoir for a high speed handler into which said parts can be dropped, and
    output sort tracks.

2. The apparatus of claim 1 wherein said input and output are located in the same proximity for ease of loading and unloading.

3. The apparatus of claim 1 wherein said tracks are substantially open U-shaped tracks.

4. The apparatus of claim 1 wherein said means for moving said fiber-faced belt is a motor driven pulley activated on demand to keep said gravity feed reservoir filled with packaged integrated circuit parts.

* * * * *